(12) United States Patent
Hu (10) Patent No.: US 11,656,200 B2
(45) Date of Patent: May 23, 2023

(54) ELECTROMAGNETIC NON-DESTRUCTIVE QUALITY TESTING METHOD, AND TESTING CIRCUIT AND SYSTEM THEREFOR

(71) Applicant: Jiangyin Tianrun Information Technology Co., Ltd, Wuxi (CN)

(72) Inventor: Zhouyi Hu, Wuxi (CN)

(73) Assignee: Jiangyin Tianrun Information Technology Co., Ltd, Wuxi (CN)

( * ) Notice: Subject to any disclaimer, the term of this patent is extended or adjusted under 35 U.S.C. 154(b) by 0 days.

(21) Appl. No.: 18/055,394

(22) Filed: Nov. 14, 2022

(65) Prior Publication Data

US 2023/0076262 A1    Mar. 9, 2023

Related U.S. Application Data (63) Continuation of application No. PCT/CN2020/101933, filed on Jul. 14, 2020.

(51) Int. Cl.
   *G01N 27/83* (2006.01)
   *G01N 27/04* (2006.01)
   (Continued)

(52) U.S. Cl.
   CPC ........... *G01N 27/83* (2013.01); *G01N 27/045* (2013.01); *G01R 27/2611* (2013.01); *G01R 29/08* (2013.01)

(58) Field of Classification Search
   CPC ...... G01N 27/82; G01N 27/83; G01N 27/045; G01R 27/2611; G01R 29/08
   (Continued)

(56) References Cited

U.S. PATENT DOCUMENTS

| | | | | |
|---|---|---|---|---|
| 4,825,158 A | * | 4/1989 | Watabe | G01N 27/023 |
| | | | | 324/237 |
| 9,213,018 B2 | * | 12/2015 | Boenisch | G01N 27/82 |
| | | (Continued) | | |

FOREIGN PATENT DOCUMENTS

| | | |
|---|---|---|
| CN | 102313777 A | 1/2012 |
| CN | 102636559 A | 8/2012 |
| | (Continued) | |

OTHER PUBLICATIONS

Internation Search Report of PCT/CN2020/101933, dated Mar. 22, 2021.

*Primary Examiner* — Jay Patidar
*Assistant Examiner* — Sean Curtis
(74) *Attorney, Agent, or Firm* — True Shepherd LLC; Andrew C. Cheng (57) ABSTRACT

A first-order resistor-inductor (RL) circuit is allowed to alternate a direct-current excitation response and a zero-input response so that a direct-current magnetic field generated by an inductor magnetizing coil changes alternately in magnetic field intensity with a change in magnitude of current. After a testing object is placed in the direct-current magnetic field changing alternately in magnetic field intensity, the testing object is magnetized and also causes a change in inductance of the magnetic field. Whether a change occurs in electromagnetic properties of the testing object can be determined and detected by detecting the inductance change of the magnetizing coil or detecting electrical characteristic change caused by the inductance change of the magnetizing coil, thereby determining whether quality defects such as steel wire cracks and wire breakage in a steel wire rope occur. Alternatively, the properties such as a sectional area or a zinc layer thickness can be analyzed.

11 Claims, 4 Drawing Sheets

(51) Int. Cl.
*G01R 27/26* (2006.01)
*G01R 29/08* (2006.01)

(58) Field of Classification Search
USPC ..................................................... 324/213
See application file for complete search history.

(56) References Cited

U.S. PATENT DOCUMENTS

| | | | | |
|---|---|---|---|---|
| 9,285,345 | B2* | 3/2016 | Boenisch | G01N 27/904 |
| 10,031,107 | B2* | 7/2018 | Boenisch | G01N 27/904 |
| 10,345,272 | B2* | 7/2019 | Holmes | G01N 29/04 |
| 2009/0237844 | A1* | 9/2009 | Duric | G01R 33/09 |
| | | | | 360/324 |
| 2012/0306483 | A1* | 12/2012 | Boenisch | G01N 27/82 |
| | | | | 324/239 |
| 2013/0127452 | A1* | 5/2013 | Boenisch | G01N 27/9006 |
| | | | | 324/242 |
| 2013/0234701 | A2* | 9/2013 | Boenisch | G01N 27/9006 |
| | | | | 324/239 |
| 2016/0266068 | A1* | 9/2016 | Boenisch | G01N 27/904 |
| 2023/0076262 | A1* | 3/2023 | Hu | G01R 29/08 |

FOREIGN PATENT DOCUMENTS

| | | | | | |
|---|---|---|---|---|---|
| CN | 103308777 | A | | 9/2013 | |
| CN | 108535329 | A | | 9/2018 | |
| CN | 111678976 | A | * | 9/2020 | ............. G01N 27/00 |
| CN | 111678976 | B | * | 1/2021 | ............. G01N 27/00 |
| CN | 110943634 | B | * | 12/2022 | ............. H02M 1/36 |
| EP | 3118618 | A2 | * | 1/2017 | ........... G01B 21/045 |
| GB | 2475314 | A | * | 5/2011 | ......... G01N 27/9033 |
| JP | 2022533328 | A | * | 7/2022 | ............. G01N 27/82 |
| JP | 7175053 | B2 | * | 11/2022 | ............. G01N 27/00 |
| KR | 20220000901 | A | * | 1/2022 | |
| KR | 102366867 | B1 | * | 2/2022 | |
| WO | WO-2021258436 | A1 | * | 12/2021 | ............. G01N 27/00 |

* cited by examiner

ELECTROMAGNETIC NON-DESTRUCTIVE QUALITY TESTING METHOD, AND TESTING CIRCUIT AND SYSTEM THEREFOR

CROSS-REFERENCE TO RELATED APPLICATIONS

This application is a continuation of International Patent Application No. PCT/CN2020/101933 with a filing date of Jul. 14, 2020, designating the United States, and further claims priority to Chinese Patent Application No. 202010577819.X with a filing date of Jun. 22, 2020. The content of the aforementioned applications, including any intervening amendments thereto, are incorporated herein by reference.

TECHNICAL FIELD

The present disclosure belongs to the field of electromagnetic testing and related applications, and relates to a testing method for detecting whether a testing object has a differential change by sensing a change in inductance of a magnetizing coil based on a direct-current excitation response and a zero-input response of a first-order resistance-inductor (RL) circuit, and a testing circuit and system for implementing such an electromagnetic non-destructive quality testing method, and in particular to electromagnetic testing applications of online, automatic, and continuous testing.

BACKGROUND

With the progress and development of industrial technology, there are increasing demands for metal wires or cables and products thereof, and increasingly higher requirements for quality. Online defect testing and control on quality indicators (e.g., a plating thickness of a zinc-plated steel wire) during high-speed production are becoming more and more important. As regards such defects or technical indicators, some of them are present on a surface and can be detected by visual identification, while others are hidden inside and cannot be sensed by visual identification. Testing methods associated with electromagnetic testing, such as eddy current testing and testing related to magnetic flux, are capable of detecting a change within a material, and are based on a mature theory. In addition, these methods can bring relatively clear effect of a magnetized testing object (properties of a ferromagnetic or non-ferromagnetic conducting material) on a magnetic field and a relationship therebetween. Therefore, such testing methods associated with electromagnetic testing are suitable testing means.

However, electromagnetic testing solutions commonly used at present include a magnetic particle testing method, a metal cross-sectional magnetic flux measuring method, a magnetic flux leakage testing method, an eddy current testing method, etc., some of which exhibit high accuracy and can realize subdivision of defects. However, these methods are widely applied in professional testing organizations or laboratories, but rarely used at industrial sites. This is because some signal generating and processing solutions are complicated with extremely high requirements for equipment and high costs, while some need to be implemented on a computer system platform and are not suitable for use at industrial sites; some rely on identification by manual intervention, and hence do not apply to automatic continuous testing, and some are unsatisfactory in testing sensitivity or very slow in response.

Existing electromagnetic testing techniques are described below.

In common electromagnetic testing applications, methods suitable for automatic testing mainly include the metal cross-sectional magnetic flux measuring method (based on the principle that the magnetic flux is directly proportional to the cross-sectional area of a metal under certain conditions) directed at ferromagnetic testing objects, the magnetic flux leakage testing method, and the eddy current testing method directed at non-ferromagnetic testing objects, which are all performed respectively by different testing procedures at present.

The metal cross-sectional magnetic flux measuring method directed at ferromagnetic testing objects is mainly used to detect a change in cross-sectional area of a steel wire rope, and includes the steps of firstly magnetically saturating the steel wire rope, then detecting a change in magnetic flux caused by the change in the cross-sectional area using a testing coil or a sensor, and converting the detected change into a voltage and current signal for analysis and processing.

The magnetic flux leakage testing method is also directed at ferromagnetic testing objects, and also includes the steps of firstly magnetically saturating a steel wire rope, then detecting magnetic flux leakage caused by wire breakage using a magnetic pickup coil, and converting the detected magnetic flux leakage into a voltage and current signal for analysis and processing, thereby providing a testing basis for determining wire breakage.

The eddy current testing method directed at non-ferromagnetic testing objects is usually used to detect a difference in reactance between different testing objects caused by eddy currents using an impedance analysis, thereby analyzing the properties of the testing objects.

All the above-mentioned methods are complicated, have the disadvantages of large-size equipment used and high costs, and thus cannot meet the requirements for continuous and online universal use.

The technical problem to be solved by the electromagnetic testing techniques is:

how to make electromagnetic testing easier and allow for continuous, online, automatic and sensitive testing. Especially, such electromagnetic testing techniques should be adapted to high-speed running of testing objects (such as wire rods, tubes or stranded ropes formed by wires) during high-speed production.

Existing inductance sensing methods and disadvantages thereof are described below.

Existing methods commonly used for inductance measurement or sensing mainly include an impedance analysis method, an alternating-current bridge method, and an inductor-capacitor (LC) oscillation method.

The impedance analysis method involves connecting an alternating-current power source with a certain frequency to an inductor to be tested through a resistor, measuring a voltage and a current on the inductor to be tested, and calculating inductive reactance. In the case of a tiny change, changes in voltage and current on the inductor to be tested are very weak, and a change in impedance angle is tiny. Especially in high-frequency testing, phase delay testing is hard. Moreover, due to uncertain electromagnetic interference at industrial sites, testing results may be affected easily by various interferences. Therefore, the impedance analysis method is not suitable for online automatic testing associated with electromagnetic testing.

The alternating-current bridge method commonly involves connecting an inductor to be tested to an alternating-current bridge, adjusting an adjustable resistor and an adjustable inductor in the alternating-current bridge to achieve bridge balance, and calculating inductance to be tested from the resistance and inductance of each bridge arm in balance. This method is not suitable for online automatic testing because continuous automatic operation can be hardly achieved.

The LC oscillation method follows the principle of LC energy conversion oscillation and involves detecting F according to $F=1/[2\pi(lc)^{1/2}]$ with fixed C and then calculating L therefrom. This method mostly uses a three-point oscillation method, and an actual application circuit may include many components. Besides, the oscillation frequency may be affected by a plurality of components, resulting in large data fluctuations. Furthermore, a change in inductance is not sensitive enough to the influence of frequency, and sensitive to electromagnetic interference. Therefore, it is also difficult for this method to meet the requirements for the reliability and sensitivity of electromagnetic testing to tiny changes in automatic online continuous testing.

SUMMARY

The present disclosure provides an online, continuous and automatic electromagnetic non-destructive testing method and a testing circuit and system using the electromagnetic non-destructive testing method, allowing electromagnetic non-destructive testing application techniques to meet the application requirements of industrial sites and to adapt to online, continuous and automatic sensitive defect or quality indicator testing in industrial sites to realize control on product quality.

To achieve the above objective, the present disclosure provides the following technical solutions.

An electromagnetic non-destructive quality testing method includes the following steps:

S1, with a first-order RL circuit as a magnetizing circuit for a magnetizing coil and the magnetizing coil as an inductor of the first-order RL circuit, allowing, by an electronic automatic control switch according to preset maximum current $I_{max}$ and minimum current $I_{min}$ of the magnetizing coil, the first-order RL circuit to alternate a direct-current excitation response and a zero-input response, wherein a direct current flowing through the magnetizing circuit increases regularly during the direct-current excitation response, and the current of the magnetizing circuit decreases regularly during the zero-input response;

S2, under the direct-current excitation response and the zero-input response of the first-order RL circuit, generating, by the magnetizing coil having the direct current changing alternately in magnitude flowing therethrough, a direct-current magnetic field changing alternately in magnetic field intensity;

S3, placing a testing object having electromagnetic susceptibility in the direct-current magnetic field changing alternately in magnetic field intensity in step S2 so that the testing object is magnetized by the magnetic field changing alternately in magnetic field intensity while causing a change in magnetic induction intensity or magnetic flux of the magnetizing coil, thereby leading to a change in inductance of the magnetizing coil, where when a differential change of the testing object is detected, a change in magnetic induction intensity or magnetic flux is caused, resulting in that the inductance of the magnetizing coil changes with the differential change of the testing object; and S4, detecting the differential change of the testing object by detecting the inductance of the magnetizing coil in the RL circuit, thereby determining whether a quality defect (e.g., a steel wire crack, a surface defect, material change, steel wire rope breakage, or incorrect arrangement) occurs, or analyzing electromagnetic properties of the testing object by detecting the inductance change of the magnetizing coil or detecting electrical characteristic change caused by the inductance change of the magnetizing coil, thereby analyzing related properties of the testing object. The related properties of the testing object include, for example, a cross-sectional area of a steel wire or a thickness of a zinc layer of a plated steel wire that is associated with magnetic flux.

The first-order RL circuit serves as the magnetizing circuit, and forms a changing magnetizing current at the moment of energizing or deenergizing the magnetizing coil during the direct-current excitation response and the zero-input response so that a changing magnetic field is generated. The testing object is magnetized as a magnetic medium in the magnetic field. Moreover, if the testing object is a conducting material, a change in the magnetic field will result in generation of an eddy current in the testing object.

The magnetic path, magnetic reluctance and magnetic conductivity of the testing object as the magnetic medium will affect the magnetic field. If the testing object is a conducting material, an eddy current will be induced in the testing object. The properties of the conducting material may also affect the magnetic field. For the magnetizing circuit, such influences may affect the inductance of the magnetizing coil. A change in electromagnetic properties of the testing object may affect a change in inductance of the magnetizing coil.

The electromagnetic properties of the testing object and changes thereof, including the material or the shape of the testing material and changes thereof, can cause changes in related magnetic path, magnetic reluctance and magnetic conductivity or cause an eddy current and a change thereof. These include but are not limited to: defects of conducting ferromagnetic tubes, rods and wires, such as surface defects, cracks, impurities doped in materials, and carbon content changes; or defects of a strand or rope of wires, such as wire breakage, strand breakage, rusting and wire protrusion; or properties or changes such as the thickness of a non-ferromagnetic conducting coating on the surface of a conducting ferromagnetic rod. Such defects may be detected by detecting the inductance of the magnetizing coil (including the influence of the testing object) and the change thereof using a magnetizing coil inductance sensing method based on the direct-current excitation response and the zero-input response of the first-order RL circuit.

The electromagnetic properties of the testing object and changes thereof further include a material or a shape and changes thereof that cause a change in eddy current with the related magnetic path, magnetic reluctance and magnetic conductivity being basically unchanged, including but not limited to a surface change of a non-ferromagnetic conducting tube, wire or cable. This may be detected by detecting a change in the inductance of the magnetizing coil (including the influence of the testing object) using a first-order RL direct-current excitation response and zero-input response circuit.

For example, when the testing object is a wire rod, a tube or a stranded rope of wires, by the metal cross-sectional magnetic flux measuring method directed at ferromagnetic testing objects, when the testing object (e.g., a steel wire rope) passes through the magnetizing coil, a change in cross-sectional area causes a change in magnetic flux passing through the magnetizing coil and also a change in inductance of the magnetizing coil. When the testing object is put through the magnetizing coil, wire breakage induces magnetic flux leakage, which causes a change in magnetic flux passing through the magnetizing coil and also a change in inductance of the magnetizing coil. An eddy current may generate a magnetic field, which plays a role as a counter magnetic field to the magnetic field of the magnetizing coil, causing a change in magnetic flux passing through the magnetizing coil and also a change in inductance of the magnetizing coil. In eddy current testing, when the testing object is placed in the alternating magnetic field of the magnetizing coil, the change in the inductance of the magnetizing coil caused by the eddy current is constant for the same testing object, that is, the inductance is fixed. When the testing object is changed, the eddy current changes and the action of the counter magnetic field also changes, leading to a different change in the inductance of the magnetizing coil caused by the eddy current. In other words, when the testing object is changed, a change in the inductance of the magnetizing coil is caused. Therefore, the situations of the objects can be detected by detecting the situations of the inductance of the magnetizing coil. Especially when the testing object is a wire rod, a tube or a stranded rope of wires, the quality of the product can be tested by detecting the inductance of the magnetizing coil after appropriate processing.

Further, a method for detecting the inductance of the magnetizing coil in the RL circuit in step S4 may be as follows: controlling, by the electronic automatic control switch, that the first-order RL circuit with the magnetizing coil as the inductor is brought into a direct-current excitation response state and a zero-input response state cyclically. In the direct-current excitation response state, the current of the magnetizing coil increases exponentially; and in the zero-input response state, the current of the magnetizing coil decreases exponentially.

The electronic automatic control switch is turned on according to preset maximum current $I_{max}$ and minimum current $I_{min}$ of the magnetizing current flowing through the magnetizing coil so that the first-order RL circuit is brought into the direct-current excitation response state.

During the direct-current excitation response of the first-order RL circuit, the electronic switch closes a power supply circuit for the magnetizing coil at the preset minimum magnetizing current $I_{min}$, and the first-order RL circuit responds to the direct-current excitation, with the magnetizing current increasing.

In the circuit theory, the current response is analyzed as follows:

$$i_1(t)=I_1(\infty)+[I_1(0+)-I_1(\infty)]e^{(-t/\tau)}$$

$$I_1(\infty)=U/R$$

$$I_1(0+)=I_{min}$$

$$\tau=L/R$$

$$i_1(t)=U/R-[U/R-I_{min}]e^{(-t/\tau)} \quad \quad 2\text{-}1$$

wherein
U: power voltage of the magnetizing circuit
L: inductance of the magnetizing circuit
R: total equivalent resistance of the power supply circuit for the magnetizing coil $I_{min}$: minimum magnetizing current
τ: time constant of the power supply circuit for the magnetizing coil In the direct-current excitation response state, the magnetizing current of the magnetizing coil increases. When the magnetizing current of the magnetizing coil increases to the preset maximum current $I_{max}$, the first-order RL circuit is switched to the zero-input response state by the electronic automatic control switch.

During the zero-input response of the first-order RL circuit, when the magnetizing current increases to the maximum magnetizing current $I_{max}$, the power supply circuit for the magnetizing coil is opened, and then the current in the magnetizing coil continues by means of the freewheeling circuit and decreases.

In the circuit theory, the current response is analyzed as follows:

$$i_1(t)=I_1(\infty)+(I_1(0+)-I_1(\infty))e^{(-t/\tau 1)}$$

$$I_1(\infty)=0, I_1(0+)=I_{max}$$

$$\tau 1=L/R1$$

$$i_1(0=I_{max}e^{(-t/\tau 1)} \quad \quad 2\text{-}2$$

where
L: inductance of the magnetizing circuit
R1: total equivalent resistance of the freewheeling circuit
$I_{max}$: maximum magnetizing current
τ1: time constant of the magnetizing circuit In the zero-input response state, the magnetizing current of the magnetizing coil decreases. When the magnetizing current of the magnetizing coil decreases to the preset minimum current $I_{min}$, the first-order RL circuit is switched to the direct-current excitation response state by the electronic automatic control switch, and the process in the direct-current excitation response state is repeated.

Thus, the first-order RL circuit is cyclically switched between the direct-current excitation response state and the zero-input response state.

According to a current-time curve function of a transitional process of the direct-current excitation response of the first-order RL circuit, when the preset maximum and minimum magnetizing currents are unchanged and other parameters in the circuit remain unchanged, the duration of the transitional process is in a linear relationship with the inductance of the magnetizing coil.

When $I_{max}$ is substituted into $i_1(t)$ in formula 2-1:

$$I_{max}=U/R-(U/R-I_{min})e^{(t-\tau 2)}$$

$$e^{(-t/\tau)}=(U/R-I_{max})/U/R-I_{min}$$

$$t/\tau=Ln((U/R-I_{min})/(U/R-I_{max})) \quad \quad 2\text{-}3$$

When the current is $I_{max}$, and time t is the duration T of the transitional process from $I_{min}$ to $I_{max}$, it can be seen that T is in a linear relationship with τ. When the voltage and the resistance remain unchanged, T is in a linear relationship with L.

According to a current-time curve function of a transitional process of the zero-input response of the first-order RL circuit, when the preset maximum and minimum magnetizing currents are unchanged and other parameters in the circuit remain unchanged, the duration of the transitional process is in a linear relationship with the inductance of the magnetizing coil.

When $I_{min}$ is substituted into $i_1(t)$ in formula 2-2:

$$I_{min}=I_{max}e^{(-t/\tau 1)}$$

$$e^{(-t/\tau 1)} = I_{min}/I_{max}$$

$$t/\tau 1 = \text{Ln}(I_{max}/I_{min}) \qquad 2\text{-}4$$

When the current is $I_{min}$, and time t is the duration T1 of the transitional process from $_{max}$ to $I_{min}$, it can be seen that $\text{Ln}(I_{max}/I_{min})$ is a constant when $I_{max}$ and $I_{min}$ are unchanged. When the resistance remains unchanged, T1 is in a linear relationship with L.

When the maximum current $I_{max}$ and the minimum current $I_{min}$ of the magnetizing coil are preset and other parameters in the circuit remain unchanged, a duration of the current changing process of the magnetizing coil is in a linear relationship with the magnitude of the inductance of the magnetizing coil. The duration of the current changing process in each response state or a frequency of cyclic changing of the two response states may be sampled to characterize an inductance changing signal of the magnetizing coil in the RL circuit. Preferably, a duration of the direct-current excitation response state of the first-order RL circuit with the magnetizing coil as the inductor, a duration of the zero-input response state of the first-order RL circuit with the magnetizing coil as the inductor or a sum of the durations of the two states may be sampled, each of which is capable of linearly characterizing the magnitude of the inductance of the magnetizing coil.

In the above-mentioned processes, the duration of any transitional process or cycle time is in a linear relationship with the inductance of the magnetizing coil, expressed by $T=K*L$. Compared with the cycle time of the typical LC oscillation, $T=K(L*C)^{1/2}$, and when C remains unchanged, $T=K\ L^{1/2}$. The method for detecting the inductance of the magnetizing coil based on the direct-current excitation response and the zero-input response of the first-order RL circuit is more sensitive and direct to a change in the inductance of the magnetizing coil.

Further, in step S4, the change in the inductance of the magnetizing coil may be detected in the magnetizing circuit with the magnetizing coil as the inductor of the first-order RL circuit by:

when the testing object has no differential change and no change is caused in the inductance of the magnetizing coil, the duration of the direct-current excitation response state of the magnetizing coil and the duration of the zero-input response state of the magnetizing coil are constant during cyclic switching; and when the testing object has the differential change which causes a change in the inductance of the magnetizing coil, the durations of the two response states vary with the change in the inductance of the magnetizing coil, and sensing the change in the inductance of the magnetizing coil by detecting the durations of the two response states, or detecting the duration of any of the two response states, or detecting the frequency of cyclic changing of the two response states.

After the maximum and minimum magnetizing currents are preset, when the electronic switch is turned on, the current in the magnetizing coil changes according to the direct-current excitation response of the first-order RL circuit. When the electronic switch is turned off, the current in the magnetizing coil continues by means of the freewheeling circuit and changes according to the zero-input response of the first-order RL circuit.

Therefore, when the state of the first-order RL circuit is circularly switched between the direct-current excitation response state and the zero-input response state, the durations of the two state processes will vary with the change in the inductance of the magnetizing coil. The inductance of the magnetizing coil may be sensed by detecting the durations of the two state processes or the duration of any state process. Moreover, when the preset maximum and minimum magnetizing currents are unchanged and other parameters in the circuit remain unchanged, the durations of the two state processes remain unchanged in the case of the same testing object and no change in the inductance of the magnetizing coil, and the cycle time T is also fixed. Hence, the testing process can be repeated and verified. Alternatively, other algorithms, e.g., adaptive filtering calculation may also be adopted. As a result, the testing result in the present disclosure has high comparability and high reliability.

Further, in step S3, testing objects continuously running in real time in a production line may be placed in the direct-current magnetic field continuously and alternately changing in magnetic field intensity so that real-time, continuous, and online automatic testing of the testing objects is achieved. Since the direct-current excitation response state and the zero-input response state of the first-order RL circuit are switched cyclically, the testing process is continuous. Hence, real-time, continuous, and online automatic testing of the running testing objects can be achieved.

Further, the maximum current $I_{max}$ and the minimum current $I_{min}$ of the magnetizing coil are set to different values according to actual testing objects, allowing for adjustment of the intensity of the magnetic field for magnetizing the testing objects and of the durations of the direct-current excitation response state and the zero-input response state of the magnetizing coil or the frequency of cyclic changing of the two response states.

The maximum current $I_{max}$ and the minimum current $I_{min}$ of the magnetizing coil may be set by a stand-alone program. In practical use, the most suitable maximum and minimum magnetizing currents may be selected manually through tests or automatically. Since different testing objects are magnetized with different magnetic field intensities, this method is adaptable to different materials and different application purposes.

Further, the voltage for the direct-current excitation response of the first-order RL circuit is adjustable and the current-limiting resistor that forms the first-order RL circuit with the magnetizing coil is selectable independently to adapt to different testing objects. Different change rates of the current of the magnetizing coil, namely different change rates of the magnetic field generated by the magnetizing coil, may be determined selectively in combination with the settings of the maximum current $I_{max}$ and the minimum current $I_{min}$ of the magnetizing coil. Thus, different magnetic field change rates are selected to adapt to different application purposes or meet the requirements of different materials of testing objects and different sites.

A testing circuit for electromagnetic non-destructive quality testing includes a direct-current voltage-stabilized power source for connection with power supply, a first-order RL circuit composed of a magnetizing coil and a current-limiting resistor, and a circuit comprising an electronic exciting current switch. The magnetizing coil is connected to a freewheeling circuit and configured to freewheel when the electronic exciting current switch is turned off.

The electronic exciting current switch is configured to connect or disconnect the first-order RL circuit composed of the magnetizing coil and the current-limiting resistor with or from the direct-current voltage-stabilized power source, bringing the first-order RL circuit into or out of a direct-current excitation response state.

When the electronic exciting current switch is turned on, a magnetizing current flows into the magnetizing coil from a positive pole of the direct-current voltage-stabilized power source through the current-limiting resistor, and then to a negative pole of the direct-current voltage-stabilized power source through the electronic exciting current switch.

The first-order RL circuit is brought into the direct-current excitation response state, and when the magnetizing current of the magnetizing coil reaches a set maximum current $I_{max}$, the electronic exciting current switch is turned off.

When the electronic exciting current switch is turned off, the freewheeling circuit provides a continuous current passage for the magnetizing coil, and the first-order RL circuit is brought into a zero-input response state with the magnetizing current decreasing exponentially. When the magnetizing current of the magnetizing coil reaches a set minimum current $I_{min}$, the electronic exciting current switch is turned on again. A direct-current excitation response and a zero-input response of the magnetizing coil are thus alternated cyclically.

Preferably, when the first-order RL circuit is brought into the direct-current excitation response state, the direct-current voltage-stabilized power source for supplying power to the first-order RL circuit is adjustable in voltage. The current-limiting resistor that forms the first-order RL circuit with the magnetizing coil is selectable independently, allowing for adjustment of a current change rate and hence adjustment of an intensity change rate of a magnetic field for magnetizing a testing object to adapt to different testing objects.

A testing system using an electromagnetic non-destructive testing method includes the testing circuit described above, and further includes a magnetizing current sampling unit, a voltage comparing unit, a voltage control unit corresponding to magnetizing current, a magnetizing current switch changeover control logic and magnetizing current switch driving unit, and an inductance sensing signal processing and outputting unit.

A voltage sampling point is disposed between the magnetizing coil and the current-limiting resistor. The magnetizing current sampling unit collects a voltage to ground of the voltage sampling point, and processes and outputs the voltage to ground to the voltage comparing unit.

The voltage control unit corresponding to magnetizing current sets a valley voltage and a peak voltage of the maximum current $I_{max}$ and the minimum current $I_{min}$ of the magnetizing coil according to preset magnetizing current information. At the stage of the direct-current excitation response of the first-order RL circuit, when the magnetizing current of the magnetizing coil reaches the maximum current $I_{max}$, the magnetizing current switch changeover control logic and magnetizing current switch driving unit turns off the electronic exciting current switch and closes the freewheeling circuit, bringing the first-order RL circuit into a zero-input response state. The magnetizing current decreases exponentially, and when the magnetizing current reaches the set minimum current $I_{min}$, the electronic exciting current switch is turned on again. The direct-current excitation response and the zero-input response of the magnetizing coil are thus alternated cyclically.

The inductance sensing signal processing and outputting unit is configured to sample a duration of the stage of the direct-current excitation response and a duration of the stage of the zero-input response, and output a change result of an inductance signal after processing.

Preferably, the testing system using an electromagnetic non-destructive testing method further includes a microprocessing unit that includes a magnetizing current setting unit, a system parameter setting unit, and an analyzing, processing and outputting unit for defects and related quality indicators of a tested product.

The magnetizing current setting unit is configured to set the maximum current $I_{max}$ and the minimum current $I_{min}$ of the magnetizing coil and output signals to the voltage control unit corresponding to magnetizing current.

The system parameter setting unit is configured to set related operation data.

The analyzing, processing and outputting unit for defects and related quality indicators of a tested product is configured to perform analysis and processing according to the signal output by the inductance sensing signal processing and outputting unit in combination with characteristics of the testing object and related parameter settings, and output a result in the form of image-text, digitals, analogs, communication, or the like.

Beneficial Effects:

The electromagnetic non-destructive quality testing method provided in the present disclosure allows the first-order RL circuit to alternate the direct-current excitation response and the zero-input response to the magnetizing coil so that the magnetic field intensity of the direct-current magnetic field generated by the magnetizing coil varies alternately with the change of the current. After the testing object having electromagnetic susceptibility is placed in the direct-current magnetic field changing alternately in magnetic field intensity, the inductance of the magnetizing coil may change. The change of the inductance is in a linear relationship with the duration of the direct-current excitation response of the magnetizing coil and the duration of the zero-input response of the magnetizing coil. Thus, the change in the inductance of the magnetic coil caused by the performance parameters of the testing object can be detected skillfully and sensitively, and the defect that online, automatic, continuous and sensitive testing cannot be achieved by electromagnetic testing is solved. The electromagnetic non-destructive quality testing method of the present disclosure is good in real-time performance, high in sensitivity, and high in reliability, and can be applied to online defect detection of wires, rods, cables or the like during high-speed production and to continuous, real-time and automatic testing of quality indicators, so as to achieve the purposes of improving quality and reducing unaccepted products. Problems can be found and corrected in time during production. In addition, this method is capable of reducing the defective rate, reducing loss, saving resources, improving the quality performance of the product, and reducing potential safety hazards.

The present disclosure is especially applicable to such testing objects as wires and rods, tubes or stranded ropes formed by wires, and such testing objects may have no change in structure under normal circumstances. With appropriate operating parameters, the defects such as wire breakage or loss, bulging and wire protrusion in the structure of a stranded rope can be found in time by online testing during production. The defects of wires and rods and property parameters such as a plating thickness can be detected online. Since the production process of products such as rods, tubes and stranded ropes is usually continuous, quality problems often occur in batches. In case of lack of effective real-time online testing, it is hard to find a change in quality or performance of products. Some products may be found to have the quality problem only after complaints are received from customers, and at this time, a lot of inferior-quality

DETAILED DESCRIPTION OF THE EMBODIMENTS

In order to deepen the understanding of the present disclosure, the present disclosure will be described in further detail below in conjunction with an embodiment and the accompanying drawings. The embodiment is only used to explain the present disclosure and does not constitute a limitation on the protection scope of the present disclosure.

EMBODIMENT

Figure 1:
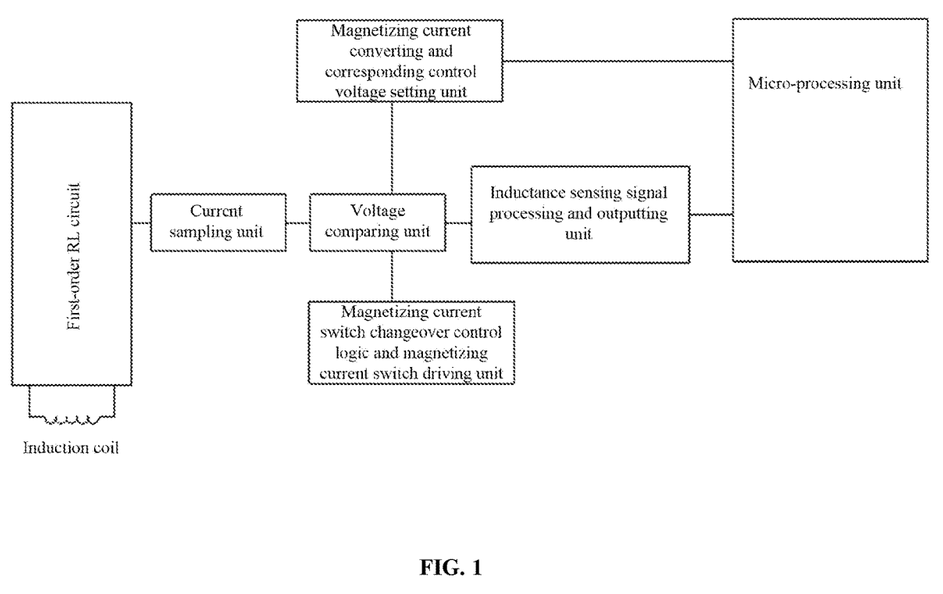
FIG. 1 is a structural diagram of a testing system using an electromagnetic non-destruction testing method according to the present disclosure.
Figure 2:
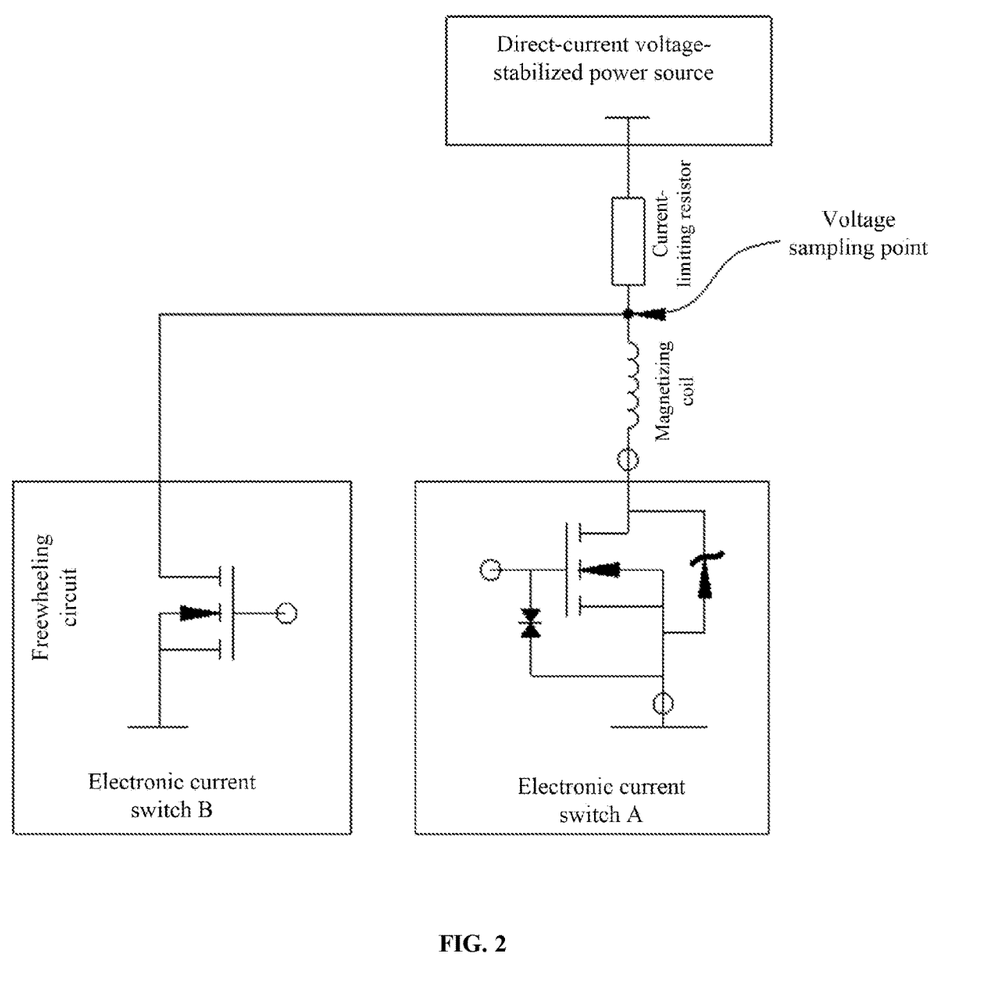
FIG. 2 is a schematic diagram of a testing circuit using an electromagnetic non-destruction testing method according to the present disclosure.

A testing system using an electromagnetic non-destructive testing method shown in FIG. 1 has a main circuit part as shown in FIG. 2.

In this solution, a first-order RL circuit is used as a magnetizing circuit, and a magnetizing coil is used as an inductor of the first-order RL circuit. The testing system includes a direct-current voltage-stabilized power source for connection with power supply, a first-order RL circuit composed of a magnetizing coil and a current-limiting resistor, and a freewheeling circuit of an electronic current switch B. The magnetizing coil is connected to the freewheeling circuit and configured to freewheel when the electronic current switch B is turned off.

The first-order RL circuit composed of the magnetizing coil and the current-limiting resistor is connected to the direct-current voltage-stabilized power source and a circuit comprising an electronic current switch A. A positive pole of the direct-current voltage-stabilized power source is connected to one end of the current-limiting resistor. The other end of the magnetizing coil is connected to the input of the electronic current switch A. A control end of the electronic current switch A is controlled by an electronic exciting current switch driving unit described below. An output end of the electronic current switch A is connected to a negative pole of the direct-current voltage-stabilized power source. The freewheeling circuit is connected to an end, connected to the input of the magnetizing coil, of the current-limiting resistor.

When the electronic current switch A is turned on, a magnetizing current flows into the magnetizing coil from the positive pole of the direct-current voltage-stabilized power source through the current-limiting resistor, and then to the negative pole of the direct-current voltage-stabilized power source through the electronic current switch A, and at this time, a direct-current excitation response of the first-order RL circuit is induced. The magnetizing coil is further independently connected in series to the freewheeling circuit with the electronic current switch B. When the electronic current switch A is turned off, the electronic current switch B is turned on so that the magnetizing coil is connected to the freewheeling circuit. At this time, a zero-input response of the first-order RL circuit is induced.

At the stage of the direct-current excitation response, the current of the magnetizing coil increases exponentially. At the stage of the zero-input response, the current of the magnetizing coil decreases exponentially.

A maximum current $I_{max}$ and a minimum current $I_{min}$ passing through the magnetizing coil are preset. At the stage of the direct-current excitation response of the first-order RL circuit, when the current of the magnetizing coil reaches the maximum current $I_{max}$, the first-order RL circuit is switched to the zero-input response. At the stage of the zero-input response of the first-order RL circuit, when the current of the magnetizing coil reaches the minimum current $I_{min}$, the first-order RL circuit is switched to the direct-current excitation response. A duration T of the stage of the direct-current excitation response and a duration $T_1$ of the stage of the zero-input response are collected.

The first-order RL circuit is cyclically switched between a direct-current excitation response state and a zero-input response state, and the magnetizing current in the magnetizing coil varies alternately between the preset maximum and minimum magnetizing currents. When the preset maximum and minimum magnetizing currents are unchanged and other parameters in the circuit remain unchanged, the durations of the two state processes remain unchanged in the case of the same testing object and no change in the inductance of the magnetizing coil. The values of the duration T of the stage of the direct-current excitation response and the duration $T_1$ of the stage of the zero-input response are constants, and the testing process is continuous.

Moreover, when continuous workpieces having a defect in an unknown position pass through the magnetizing coil, the duration T of the stage of the direct-current excitation response and the duration $T_1$ of the stage of the zero-input response are collected, and the position of the workpiece defect can be located when T or $T_1$ changes.

In related use, a changing magnetizing current is formed at the moment of energizing or deenergizing the magnetizing coil during the direct-current excitation response and the zero-input response so that a changing magnetic field is generated. The testing object is magnetized as a magnetic medium in the magnetic field. Moreover, if the testing object is a conducting material, a change in the magnetic field will result in generation of an eddy current in the testing object.

The magnetic path, magnetic reluctance and magnetic conductivity of the testing object as the magnetic medium will affect the magnetic field. If the testing object is a conducting material, an eddy current will be induced in the testing object. The properties of the conducting material may also affect the magnetic field. For the magnetizing circuit, such influences may affect the inductance of the magnetizing coil.

The electromagnetic properties of the testing object and changes thereof may affect the inductance of the magnetizing coil (including the influence of the testing object) and the change thereof.

The electromagnetic properties of the testing object and changes thereof, including the material or the shape of the testing material and changes thereof, can cause changes in related magnetic path, magnetic reluctance and magnetic conductivity or cause an eddy current and a change thereof. These include but are not limited to: defects of conducting ferromagnetic tubes, rods and wires, such as surface defects, cracks, impurities doped in materials, and carbon content changes; or defects of a strand or rope of wires, such as wire breakage, strand breakage, rusting and wire protrusion; or properties or changes such as the thickness of a non-ferromagnetic conducting coating on the surface of a conducting ferromagnetic rod.

The electromagnetic properties of the testing object and changes thereof further include a material or a shape and changes thereof that cause a change in eddy current with the related magnetic path, magnetic reluctance and magnetic conductivity being basically unchanged, including but not limited to a surface change of a non-ferromagnetic conducting tube, wire or cable.

The embodiment is implemented in a general form. Different magnetizing coils, different resistors and different magnetizing currents may be used to form different steel wire defect detectors, steel wire rope (e.g., steel wire ropes for hoisting, and steel cords for tires) defect detectors, etc.

The testing system using an electromagnetic non-destructive testing method shown in FIG. 1 includes the first-order RL circuit shown in FIG. 2, and further includes a current sampling unit, a voltage comparing unit, a voltage control unit corresponding to magnetizing current, a micro-processing unit, a magnetizing current switch changeover control logic and magnetizing current switch driving unit, and an inductance sensing signal processing and outputting unit, and the connection relationship of such units is as shown in the figure.

A voltage sampling point is disposed between the magnetizing coil and the current-limiting resistor. The magnetizing current sampling unit collects a voltage to ground of the voltage sampling point, and processes and outputs the voltage to ground to the voltage comparing unit for analysis of the magnetizing current switch changeover control logic. As described for the main circuit, the voltage to ground of the voltage sampling point decreases with the increase of the magnetizing current in the magnetizing coil and increases with the decrease of the magnetizing current in the magnetizing coil.

The voltage control unit corresponding to magnetizing current receives preset magnetizing current information from the micro-processing unit and sets a valley voltage and a peak voltage of the maximum current $I_{max}$ and the minimum current $I_{min}$ of the magnetizing coil. At the stage of the direct-current excitation response of the first-order RL circuit, when the magnetizing current of the magnetizing coil reaches the maximum current $I_{max}$, the magnetizing current switch changeover control logic and magnetizing current switch driving unit turns off the electronic current switch A and turns on the electronic current switch B, bringing the first-order RL circuit into the zero-input response. The magnetizing current decreases through the freewheeling circuit. When the magnetizing current reaches the minimum current $I_{min}$, the magnetizing current switch changeover control logic and magnetizing current switch driving unit turns on the electronic current switch A and turns off the electronic current switch B, causing the magnetizing current to increase and bringing the first-order RL circuit into the stage of the direct-current excitation response again.

The voltage comparing unit compares voltage signals from the magnetizing current sampling unit with the valley voltage and the peak voltage corresponding to the maximum and minimum magnetizing currents of the magnetizing coil set by the voltage control unit corresponding to magnetizing current, and outputs the results to the magnetizing current switch changeover control logic and magnetizing current switch driving unit described below.

The magnetizing current switch changeover control logic and magnetizing current switch driving unit determines whether to change the state of the magnetizing current switch in time according to the output signals from the voltage comparing unit, and the following specific processes are performed cyclically.

Process 1: when the electronic current switch A is turned on and the electronic current switch B is turned off, the magnetizing current of the magnetizing coil increases exponentially and the voltage signal of the magnetizing current sampling unit decreases exponentially. When the voltage signal of the magnetizing current sampling unit decreases to the valley voltage corresponding to the maximum magnetizing current of the magnetizing coil set by the voltage control unit corresponding to magnetizing current, the voltage comparing unit outputs a state signal of comparison result change output. The magnetizing current switch changeover control logic and magnetizing current switch driving unit receives the state signal, and then turns on the electronic current switch B and turns off the electronic current switch A. The magnetizing current of the magnetizing coil decreases exponentially afterwards, while the voltage signal of the magnetizing current sampling unit increases.

Process 2: when the voltage signal of the magnetizing current sampling unit increases to the peak voltage corresponding to the minimum magnetizing current of the magnetizing coil set by the voltage control unit corresponding to magnetizing current, the voltage comparing unit outputs a state signal of comparison result change output. The magnetizing current switch changeover control logic and magnetizing current switch driving unit receives the state signal, and then turns on the electronic current switch A and turns off the electronic current switch B. The state is then switched to process 1. The magnetizing current is cyclically changed between the two states of the process 1 and the process 2.

Figure 3:
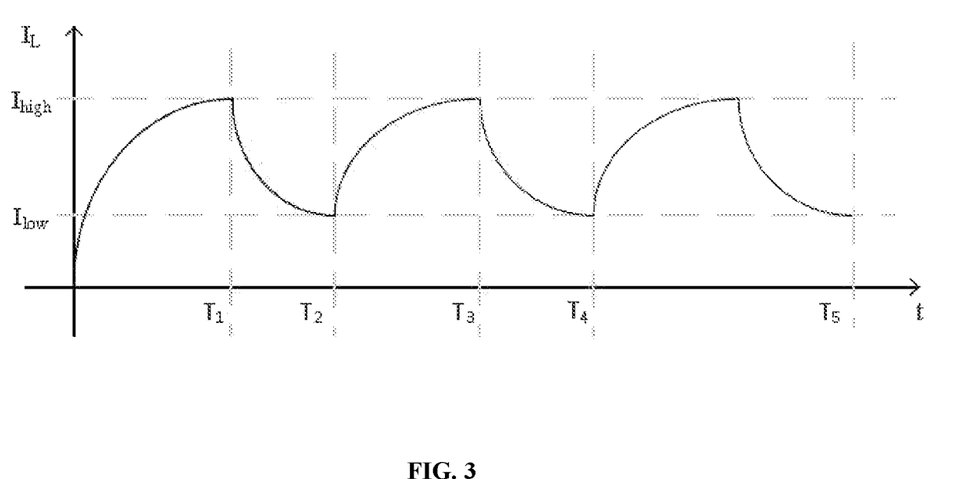
FIG. 3 is a waveform illustration of a magnetizing current in an embodiment of the present disclosure.
Figure 4:
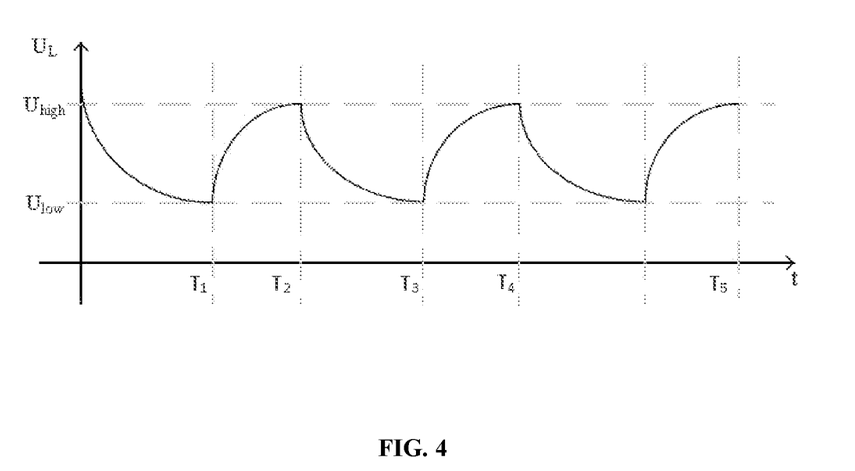
FIG. 4 is a voltage waveform illustration of a voltage sampling point in an embodiment of the present disclosure.

The waveform of the magnetizing current in the two processes described above is as shown in FIG. 3. The waveform of the voltage to ground of the voltage sampling point in the two states is as shown in FIG. 4.

The inductance sensing signal processing and outputting unit samples the duration T of the stage of the direct-current excitation response and the duration $T_1$ of the stage of the zero-input response, and outputs a result to the micro-processing unit. The micro-processing unit performs comparison, gives a warning, etc.

The micro-processing unit includes a magnetizing current setting unit, a system parameter setting unit, and an analyzing, processing and outputting unit for defects and related quality indicators of a tested product.

The magnetizing current setting unit is configured to set the maximum current $I_{max}$ and the minimum current $I_{min}$ of the magnetizing coil and outputs signals to the voltage control unit corresponding to magnetizing current.

The system parameter setting unit is configured to set related operation data.

The analyzing, processing and outputting unit for defects and related quality indicators of a tested product is configured to perform analysis and processing according to the signal output by the inductance sensing signal processing and outputting unit in combination with characteristics of the testing object and related parameter settings, and output a result in the form of image-text, digitals, analogs, communication, or the like.

The analyzing, processing and outputting unit for defects and related quality indicators of a tested product performs analysis and processing according to the signal output by the inductance sensing signal processing and outputting unit in combination with characteristics of the testing object and related parameter settings, and outputs a result in the form of image-text, digitals, analogs, communication, or the like.

The magnetizing current is cyclically changed in the two processes described above from the set maximum to the set minimum and then from the minimum to the maximum, and the cycle depends on the following aspects:

a: the magnitude of the voltage of the direct-current voltage-stabilized power source;

b: the resistance of the current-limiting resistor;

c: the setting of a corresponding control voltage based on the converted magnetizing current; and d: the equivalent inductance of the magnetizing coil (including the influence of the testing object).

Actually, for different testing objects and testing purposes, namely in different applications, the above-mentioned aspects may differ slightly.

For a specific application, a, b and c are usually kept constant or some parameters are changed regularly. For specific values of a, b and c, the duration of the increasing process, the duration of the decreasing process or the cycle or the frequency of the magnetizing current is a monodrome function of the equivalent inductance of the magnetizing coil (including the influence of the testing object), which may be used as the inductance sensing signal and then processed and output as designed.

The specific testing process is now illustrated by taking the example of testing the quality of a steel wire rope using the system of the present disclosure. When the system operates, the steel wire rope as the testing object passes through the solenoidal magnetizing coil which is slightly thicker than the steel wire. The properties of the steel wire rope may affect the inductance of the magnetizing coil, and the influence on the inductance may be detected by detecting the inductance sensing signal, namely the duration of the transitional process or the change frequency. When the steel wire rope is normal, the material has good consistency and the properties of the magnetic field have good consistency. Therefore, the inductance of the magnetizing coil is consistent and the detected duration of the transitional process or the detected change frequency is consistent. When the steel wire rope is abnormal, the properties of the magnetic field are inconsistent, and a change may occur in the inductance of the magnetizing coil. The consistency in this case can be detected by detecting the inductance sensing signal, namely the duration of the transitional process or the change frequency. A signal detected is then input to the micro-processing unit, and compared with preset parameters. Finally, a defect signal is output after determination and confirmation.

The foregoing are merely descriptions of the preferred embodiment of the present disclosure, and are not used to limit the present disclosure. Any modifications, equivalent replacements, improvements made within the spirit and principle of the present disclosure shall fall within the protection scope of the present disclosure.

What is claimed is:

1. An electromagnetic non-destructive quality testing method, comprising the following steps:
S1, with a first-order resistor-inductor (RL) circuit as a magnetizing circuit for a magnetizing coil and the magnetizing coil as an inductor of the first-order RL circuit, allowing, by an electronic automatic control switch according to preset maximum current $I_{max}$ and minimum current $I_{min}$ of the magnetizing coil, the first-order RL circuit to alternate a direct-current excitation response and a zero-input response, wherein a direct current flowing through the magnetizing circuit increases regularly during the direct-current excitation response, and the current of the magnetizing circuit decreases regularly during the zero-input response;

S2, under the direct-current excitation response and the zero-input response of the first-order RL circuit, generating, by the magnetizing coil having the direct current changing alternately in magnitude flowing therethrough, a direct-current magnetic field changing alternately in magnetic field intensity;

S3, placing a testing object having electromagnetic susceptibility in the direct-current magnetic field changing alternately in magnetic field intensity in step S2 so that the testing object is magnetized by the magnetic field changing alternately in magnetic field intensity while causing a change in magnetic induction intensity or magnetic flux of the magnetizing coil, thereby leading to a change in inductance of the magnetizing coil, wherein when a differential change of the testing object is detected, a change in magnetic induction intensity or magnetic flux is caused, resulting in that the inductance of the magnetizing coil changes with the differential change of the testing object; and S4, detecting the differential change of the testing object by detecting the inductance of the magnetizing coil in the RL circuit, thereby determining whether a quality defect occurs, or analyzing electromagnetic properties of the testing object by detecting the inductance change of the magnetizing coil or detecting electrical characteristic change caused by the inductance change of the magnetizing coil, thereby analyzing related properties of the testing object.

2. The method according to claim 1, wherein a method for detecting the inductance of the magnetizing coil in the RL circuit in step S4 is as follows: controlling, by the electronic automatic control switch, that the first-order RL circuit with the magnetizing coil as the inductor is brought into a direct-current excitation response state and a zero-input response state cyclically, wherein in the direct-current excitation response state, the current of the magnetizing coil increases exponentially; in the zero-input response state, the current of the magnetizing coil decreases exponentially; when the maximum current $I_{max}$ and the minimum current $I_{min}$ of the magnetizing coil are preset and other parameters in the circuit remain unchanged, a duration of the current changing process of the magnetizing coil is in a linear relationship with the magnitude of the inductance of the magnetizing coil; and the duration of the current changing process in each response state or a frequency of cyclic changing of the two response states is sampled to amplify an inductance changing signal of the magnetizing coil in the RL circuit.

3. The method according to claim 2, wherein a duration of the direct-current excitation response state of the first-order RL circuit with the magnetizing coil as the inductor, a duration of the zero-input response state of the first-order RL circuit with the magnetizing coil as the inductor or a sum of the durations of the two states is sampled, each of which is capable of linearly characterizing the magnitude of the inductance of the magnetizing coil.

4. The method according to claim 3, wherein in step S4, the change in the inductance of the magnetizing coil is detected in the magnetizing circuit with the magnetizing coil as the inductor of the first-order RL circuit by:
turning on the electronic automatic control switch according to the preset maximum current $I_{max}$ and minimum current $I_{min}$ of the magnetizing current flowing through the magnetizing coil so that the first-order RL circuit is brought into the direct-current excitation response state;

in the direct-current excitation response state in which the magnetizing current of the magnetizing coil increases, when the magnetizing current of the magnetizing coil increases to the preset maximum current $I_{max}$, turning off the electronic automatic control switch so that the first-order RL circuit is switched to the zero-input response state;

in the zero-input response state in which the magnetizing current of the magnetizing coil decreases, when the magnetizing current of the magnetizing coil decreases to the preset minimum current $I_{min}$, turning on the electronic automatic control switch so that the first-order RL circuit is switched to the direct-current excitation response state, and repeating the process in the direct-current excitation response state;

cyclically switching the first-order RL circuit between the direct-current excitation response state and the zero-input response state;

wherein when the testing object has no differential change and no change is caused in the inductance of the magnetizing coil, the duration of the direct-current excitation response state of the magnetizing coil and the duration of the zero-input response state of the magnetizing coil are constant during cyclic switching; and wherein when the testing object has the differential change which causes a change in the inductance of the magnetizing coil, the durations of the two response states vary with the change in the inductance of the magnetizing coil, and sensing the change in the inductance of the magnetizing coil by detecting the durations of the two response states, or detecting the duration of any of the two response states, or detecting the frequency of cyclic changing of the two response states.

5. The method according to claim 1, wherein in step S3, testing objects continuously running in real time in a production line are placed in the direct-current magnetic field continuously and alternately changing in magnetic field intensity so that real-time, continuous, and online automatic testing of the testing objects is achieved.

6. The method according to claim 1, wherein the maximum current $I_{max}$ and the minimum current $I_{min}$ of the magnetizing coil are set to different values according to actual testing objects, allowing for adjustment of the intensity of the magnetic field for magnetizing the testing objects and of the durations of the direct-current excitation response state and the zero-input response state of the magnetizing coil or the frequency of cyclic changing of the two response states.

7. A testing circuit for electromagnetic non-destructive quality testing, comprising a direct-current voltage-stabilized power source for connection with power supply, a first-order RL circuit composed of a magnetizing coil and a current-limiting resistor, and a circuit comprising an electronic exciting current switch, wherein the magnetizing coil is connected to a freewheeling circuit and configured to freewheel when the electronic exciting current switch is turned off;

the electronic exciting current switch is configured to connect or disconnect the first-order RL circuit composed of the magnetizing coil and the current-limiting resistor with or from the direct-current voltage-stabilized power source, bringing the first-order RL circuit into or out of a direct-current excitation response state;

when the electronic exciting current switch is turned on, a magnetizing current flows into the magnetizing coil from a positive pole of the direct-current voltage-stabilized power source through the current-limiting resistor, and then to a negative pole of the direct-current voltage-stabilized power source through the electronic exciting current switch;

the first-order RL circuit is brought into the direct-current excitation response state, and when the magnetizing current of the magnetizing coil reaches a set maximum current $I_{max}$, the electronic exciting current switch is turned off; and when the electronic exciting current switch is turned off, the freewheeling circuit provides a continuous current passage for the magnetizing coil, and the first-order RL circuit is brought into a zero-input response state with the magnetizing current decreasing exponentially; when the magnetizing current reaches a set minimum current $I_{min}$, the electronic exciting current switch is turned on again; and a direct-current excitation response and a zero-input response of the magnetizing coil are thus alternated cyclically.

8. The testing circuit according to claim 7, wherein when the first-order RL circuit is brought into the direct-current excitation response state, the direct-current voltage-stabilized power source for supplying power to the first-order RL circuit is adjustable in voltage; and the current-limiting resistor that forms the first-order RL circuit with the magnetizing coil is selectable independently, allowing for adjustment of a current change rate and hence adjustment of an intensity change rate of a magnetic field for magnetizing a testing object to adapt to different testing objects.

9. A testing system using an electromagnetic non-destructive quality testing method, comprising a testing circuit that comprises a circuit formed by connecting a first-order RL circuit composed of a magnetizing coil and a current-limiting resistor to a direct-current voltage-stabilized power source and an electronic exciting current switch, with the magnetizing coil being connected to a freewheeling circuit;

the electronic exciting current switch is configured to control a circuit formed by the first-order RL circuit composed of the magnetizing coil and the current-limiting resistor, and the direct-current voltage-stabilized power source;

when the electronic exciting current switch is turned on, a magnetizing current flows into the magnetizing coil from a positive pole of the direct-current voltage-stabilized power source through the current-limiting resistor, and then to a negative pole of the direct-current voltage-stabilized power source through the electronic exciting current switch, inducing a direct-current excitation response of the magnetizing coil; when the magnetizing current of the magnetizing coil reaches a set maximum current $I_{max}$, the electronic exciting current switch is turned off;

when the electronic exciting current switch is turned off, the freewheeling circuit provides a continuous current passage for the magnetizing coil, inducing a zero-input response of the magnetizing coil with the magnetizing current decreasing exponentially; when the magnetizing current of the magnetizing coil reaches a set minimum current $I_{min}$, the electronic exciting current switch is turned on again; and the direct-current excitation response and the zero-input response of the magnetizing coil are thus alternated cyclically;

a testing object having electromagnetic susceptibility is placed in a direct-current magnetic field changing alternately in magnetic field intensity so that the testing object is magnetized by the magnetic field changing alternately in magnetic field intensity while causing a change in magnetic induction intensity or magnetic flux of the magnetizing coil, thereby leading to a change in inductance of the magnetizing coil; when a differential change of the testing object is detected, a change in magnetic induction intensity or magnetic flux is caused, resulting in that the inductance of the magnetizing coil changes with the differential change of the testing object; and the differential change of the testing object is detected by detecting the inductance of the magnetizing coil in the RL circuit, thereby determining whether a quality defect occurs; or electromagnetic properties of the testing object are analyzed by detecting the inductance of the magnetizing coil, thereby analyzing related properties of the testing object.

10. The testing system according to claim 9, further comprising a magnetizing current sampling unit, a voltage comparing unit, a voltage control unit corresponding to magnetizing current, a magnetizing current switch changeover control logic and magnetizing current switch driving unit, and an inductance sensing signal processing and outputting unit, wherein a voltage sampling point is disposed between the magnetizing coil and the current-limiting resistor; the magnetizing current sampling unit collects a voltage to ground of the voltage sampling point, and processes and outputs the voltage to ground to the voltage comparing unit;

the voltage control unit corresponding to magnetizing current sets a valley voltage and a peak voltage of the maximum current $I_{max}$ and the minimum current $I_{min}$ of the magnetizing coil according to preset magnetizing current information; at the stage of the direct-current excitation response of the first-order RL circuit, when the magnetizing current of the magnetizing coil reaches the maximum current $I_{max}$, the magnetizing current switch changeover control logic and magnetizing current switch driving unit turns off the electronic exciting current switch and closes the freewheeling circuit, bringing the first-order RL circuit into a zero-input response state; the magnetizing current decreases exponentially; when the magnetizing current reaches the set minimum current $I_{min}$, the electronic exciting current switch is turned on again; and the direct-current excitation response and the zero-input response of the magnetizing coil are thus alternated cyclically; and the inductance sensing signal processing and outputting unit is configured to sample a duration of the stage of the direct-current excitation response and a duration of the stage of the zero-input response or a frequency of cyclic changing thereof, and output a change result of an inductance signal after processing.

11. The testing system using an electromagnetic nondestructive testing method according to claim 9, further comprising a micro-processing unit that comprises a magnetizing current setting unit, a system parameter setting unit, and an analyzing, processing and outputting unit for defects and related quality indicators of a tested product, wherein the magnetizing current setting unit is configured to set the maximum current $I_{max}$ and the minimum current $I_{min}$ of the magnetizing coil and output signals to the voltage control unit corresponding to magnetizing current;

the system parameter setting unit is configured to set related operation data; and the analyzing, processing and outputting unit for defects and related quality indicators of a tested product is configured to perform analysis, processing and outputting according to the signal output by the inductance sensing signal processing and outputting unit in combination with characteristics of the testing object and related parameter settings.

* * * * *